(12) United States Patent
Chitnis et al.

(10) Patent No.: US 9,196,799 B2
(45) Date of Patent: *Nov. 24, 2015

(54) LED CHIPS HAVING FLUORESCENT SUBSTRATES WITH MICROHOLES AND METHODS FOR FABRICATING

(75) Inventors: Ashay Chitnis, Santa Barbara, CA (US); Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 831 days.

This patent is subject to a terminal disclaimer.

(21) Appl. No.: 12/229,366

(22) Filed: Aug. 22, 2008

(65) Prior Publication Data

US 2009/0065790 A1    Mar. 12, 2009

Related U.S. Application Data

(63) Continuation-in-part of application No. 11/656,759, filed on Jan. 22, 2007, and a continuation-in-part of application No. 11/899,790, filed on Sep. 7, 2007.

(51) Int. Cl.
*H01L 33/00* (2010.01)
*H01L 33/44* (2010.01)
(Continued)

(52) U.S. Cl.
CPC .............. *H01L 33/44* (2013.01); *H01L 33/505* (2013.01); *H01L 33/508* (2013.01); *H01L 33/62* (2013.01); *H01L 23/3114* (2013.01); *H01L 33/38* (2013.01); *H01L 2924/0002* (2013.01)

(58) Field of Classification Search
CPC .................................................. H01L 23/3114
See application file for complete search history.

(56) References Cited

U.S. PATENT DOCUMENTS 4,946,547 A    8/1990   Palmour et al.
5,200,022 A    4/1993   Kong et al.
(Continued)

FOREIGN PATENT DOCUMENTS

DE    19945672         6/2000
EP    1198016 A2       4/2002
(Continued)

OTHER PUBLICATIONS

Nichia Corp. White LED Part No. NSPW300BS, Specification for Nichia White LED Model NSPW300BS. pp. 1-14, 2004.
(Continued)

*Primary Examiner* — Fernando L Toledo
*Assistant Examiner* — Valerie N Newton
(74) *Attorney, Agent, or Firm* — Koppel, Patrick, Heybl & Philpott (57) ABSTRACT

Methods for fabricating semiconductor devices such as LED chips at the wafer level, and LED chips and LED chip wafers fabricated using the methods. An LED chip wafer according to the present invention comprises a plurality of LEDs on a wafer and a plurality of pedestals, each of which is on one of the LEDs. A fluorescent substrate or preform ("preform") is provided covering at least some of the LEDs, the preform comprising holes with the pedestals arranged within the holes. During operation of the covered ones of said LEDs at least some light from the LEDs passes through the preform and is converted. LED chips are provided that are singulated from this LED chip wafer. One embodiment of a method for fabricating LED chips from a wafer comprises depositing LED epitaxial layers on an LED growth wafer to form a plurality of LEDs on the growth wafer. Pedestals are formed on the LEDs and a fluorescent preform is formed with holes. The fluorescent preform is bonded over at least some of the plurality of LEDs so that at least some light from the covered ones of said LEDs passes through the preform and is converted. The pedestals are arranged in the holes so that an electrical signal is applied to the LEDs through the pedestals.

28 Claims, 6 Drawing Sheets

(51) Int. Cl.
*H01L 33/50* (2010.01)
*H01L 33/62* (2010.01)
*H01L 23/31* (2006.01)
*H01L 33/38* (2010.01)

(56) References Cited

U.S. PATENT DOCUMENTS

| | | | |
|---|---|---|---|
| RE34,861 E | 2/1995 | Davis et al. | |
| 5,959,316 A | 9/1999 | Lowery | 257/98 |
| 6,504,180 B1 | 1/2003 | Hermans et al. | |
| 6,744,196 B1 | 6/2004 | Jeon | 313/498 |
| 7,714,348 B2* | 5/2010 | Fan et al. | 257/99 |
| 2001/0000622 A1 | 5/2001 | Reeh et al. | 257/98 |
| 2002/0028527 A1* | 3/2002 | Maeda et al. | 438/29 |
| 2002/0056847 A1 | 5/2002 | Uemura et al. | 257/89 |
| 2004/0041159 A1 | 3/2004 | Yuri et al. | 257/79 |
| 2004/0061433 A1 | 4/2004 | Izuno et al. | 313/498 |
| 2004/0188697 A1 | 9/2004 | Brunner et al. | 257/99 |
| 2004/0245530 A1 | 12/2004 | Kameyama et al. | 257/80 |
| 2005/0184305 A1 | 8/2005 | Ueda | 257/99 |
| 2006/0003477 A1* | 1/2006 | Braune et al. | 438/29 |
| 2006/0145170 A1 | 7/2006 | Cho | 257/95 |
| 2006/0157721 A1 | 7/2006 | Tran et al. | 257/98 |
| 2006/0189098 A1 | 8/2006 | Edmond et al. | |
| 2006/0261292 A1 | 11/2006 | Kim et al. | 250/551 |
| 2007/0001182 A1 | 1/2007 | Schardt et al. | 257/98 |
| 2007/0158668 A1 | 7/2007 | Tarsa et al. | 257/98 |
| 2007/0257335 A1* | 11/2007 | O'Brien | 257/618 |
| 2008/0121911 A1* | 5/2008 | Andrews et al. | 257/98 |
| 2008/0173884 A1* | 7/2008 | Chitnis et al. | 257/98 |

FOREIGN PATENT DOCUMENTS

| | | |
|---|---|---|
| JP | 10163525 | 6/1998 |
| JP | 10163525 A | 6/1998 |
| JP | 2000349346 | 12/2000 |
| JP | 2002118293 | 4/2002 |
| JP | 2002118293 A | 4/2002 |
| JP | 20037929 A | 1/2003 |
| JP | 2003007929 | 1/2003 |
| JP | 2004031856 | 1/2004 |
| JP | 2004266240 | 9/2004 |
| JP | 2004363342 | 12/2004 |
| JP | 2005252222 | 9/2005 |
| JP | 2006245020 | 6/2006 |
| JP | 2006245020 | 9/2006 |
| JP | 2006253370 | 9/2006 |
| JP | 2008532281 | 8/2008 |
| WO | WO 2006065015 | 6/2006 |

OTHER PUBLICATIONS

Nichia Corp. White LED Part No. NSPW312BS, Specification for Nichia White LED Model NSPW312BS. pp. 1-14, 2004.
U.S. Appl. No. 11/899,790, filed Sep. 7, 2007, to Chitnis, "Wafer Level Phosphor Coating Method and Devices Fabricated Utilizing Method".
U.S. Appl No. 11/656,759, filed Jan. 22, 2007, to Chitnis, "Wafer Level Phosphor Coating Method and Devices Fabricated Utilizing Method".
U.S. Appl. No. 61/072,546 "Emission Tuning Methods and Devices Fabricated Utilizing Methods."
Notification of the Third Office Action from Chinese Appl. No. 200780050127.2, dated Mar. 28, 2012.
Decision of Rejection from Japanese Appl. No. 2009-547218, dated Mar. 8, 2012.
Decision of Rejection from Japanese Appl. No. 2009-547219, dated Mar. 8, 2012.
Office Action from U.S. Appl. No. 11/899,790, dated Jul. 22, 2009.
Response to Office Action from U.S. Appl. No. 11/899,790, filed Aug. 24, 2009. OA dated Jul. 22, 2009.
Office Action from U.S. Appl. No. 11/899,790, dated Nov. 13, 2009.
Response to Office Action from U.S. Appl. No. 11/899,790, filed Mar. 15, 2010, OA dated Nov. 13, 2009.
Office Action from U.S. Appl. No. 11/899,790, dated Jun. 2, 2010.
Response to Office Action from U.S. Appl. No. 11/899,790, filed Nov. 1, 2010, OA dated Jun. 2, 2010.
Office Action from U.S. Appl. No. 11/899.790, dated Mar. 21, 2011.
Response to Office Action from U.S. Appl. No. 11/899.790, filed Jun. 21, 2011. OA dated Mar. 21, 2011.
Office Action from U.S. Appl. No. 11/899.790, dated Jul. 27, 2011.
Response to Office Action from U.S. Appl. No. 11/899.790, filed Nov. 22, 2011, OA dated Jul. 27, 2011.
Office Action from U.S. Appl. No. 11/899,790, dated Jan. 12, 2012.
Response to Office Action from U.S. Appl. No. 11/899,790, filed Mar. 8, 2012. OA dated Jan. 12, 2012.
Office Action from U.S. Appl. No. 11/899,790, dated Apr. 5, 2012.
Response to Office Action from U.S. Appl. No. 11/899,790, filed Apr. 13, 2012. OA dated Jan. 12, 2012.
Notification of Reasons for Rejection from Japanese Patent Appl. No. 2009-547218. dated Sep. 16, 2011.
Notice of Rejection Japanese Patent Appl. No. 2006-526964, dated Aug. 19, 2011.
Notification of Reasons for Rejection from Japanese Patent Appl. No. 2009-547219, dated Sep. 16, 2011.
International Preliminary Examination Report for Appl. No. PCT/US07/24367. dated Jun. 29, 2011.
International Preliminary Examination Report for Appl. No. PCT/US07/24366. dated Jun. 29, 2011.
Notification of the Second Office Action from Chinese Patent Appl. No. 200780050127.2, dated Jun. 15, 2011.
Office Action from U.S. Appl. No. 11/656,759, dated Dec. 4, 2008.
Response to Office Action from U.S. Appl. No. 11/656,759, filed Feb. 4, 2009, OA dated Dec. 4, 2008.
Office Action from U.S. Appl. No. 11/656,759, dated Feb. 27, 2009.
Response to Office Action from U.S. Appl. No. 11/656,759, filed Jul. 24, 2009. OA dated Feb. 27, 2009.
Office Action from U.S. Appl. No. 11/656,759, dated Nov. 25, 2009.
Response to Office Action from U.S. Appl. No. 11/656,759, filed Apr. 26, 2010, OA dated Nov. 25, 2010.
Office Action from U.S. Appl. No. 11/656,759, dated May 21, 2010.
Response to Office Action from U.S. Appl. No. 11/656.759, filed Nov. 22, 2010, OA dated May 21, 2010.
Office Action from U.S. Appl. No. 11/656,759, dated Mar. 9, 2011.
Response to Office Action from U.S. Appl. No. 11/656,759, filed Aug. 9, 2011, OA dated Mar. 9, 2011.
Office Action from U.S. Appl. No. 11/656,759, dated Sep. 23, 2011.
Response to Office Action from U.S. Appl. No. 11/656,759, filed Jan. 16, 2012, OA dated Sep. 23, 2011.
Office Action from U.S. Appl. No. 11/656,759 dated May 1, 2012.

* cited by examiner

LED CHIPS HAVING FLUORESCENT SUBSTRATES WITH MICROHOLES AND METHODS FOR FABRICATING

This application is a continuation-in-part of and claims the benefit of U.S. patent application Ser. No. 11/656,759 to Chitnis et al., filed on Jan. 22, 2007, and U.S. patent application Ser. No. 11/899,790 to Chitnis et al., filed on Sep. 7, 2007.

BACKGROUND OF THE INVENTION

1. Field of the Invention

This invention relates to methods for fabricating semiconductor devices and in particular methods for wafer level covering of light emitting diodes with a conversion material.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

With these approaches the key challenge is accessing the wire bond pad on the device after the coating process. Accessing the wire bond by standard wafer fabrication techniques is difficult with typical silicone binding material, as well as other binder materials such as epoxies or glass. Silicones are not compatible with commonly used wafer fabrication materials such as acetone, as well as some developers, and resist strippers. This can limit the options and choices for the particular silicones and process steps. Silicones are also cured at high temperature (greater than 150° C.), which is beyond the glass transition temperature of commonly used photoresists. Cured silicone films with phosphor are also difficult to etch and have a very slow etch rate in chlorine and $CF_4$ plasma, and wet etching of cured silicones is typically inefficient.

SUMMARY OF THE INVENTION

The present invention discloses new methods for fabricating semiconductor devices such as LED chips at the wafer level, and discloses LED chips and LED chip wafers fabricated using the methods. One embodiment of a light emitting diode (LED) chip wafer, comprises a plurality of LEDs on a wafer, with the wafer comprising a first alignment element. A fluorescent preform is included covering at least some of the LEDs, with the preform comprising a second alignment element. The first and second alignment elements cooperate to provide the desired alignment of the preform over the LEDs.

Another embodiment of an LED chip wafer according to the present invention comprises a plurality of LEDs on a wafer and a plurality of pedestals, each of which is on one of the LEDs. A fluorescent substrate or preform is provided covering at least some of the LEDs, the preform comprising holes with the pedestals arranged within the holes. During operation of the covered ones of the LEDs, at least some light from the LEDs passes through the preform and is converted.

One embodiment of an LED chip according to the present invention comprises an LED and a pedestal in electrical contact with the LED. A fluorescent preform is bonded to and at least partially covers the LED, with the preform having a hole with the pedestal arranged in the hole. At least some of the light emitted by the LED passes through and is converted by the preform.

One embodiment of a method for fabricating light emitting diode (LED) chips from a wafer, comprises depositing LED epitaxial layers on an LED growth wafer to form a plurality of LEDs on the growth wafer. Pedestals are formed on the LEDs and a fluorescent preform is formed with holes. The fluorescent preform is bonded over at least some of the plurality of LEDs so that at least some light from the covered ones of the LEDs passes through the preform and is converted. The pedestals are arranged in the holes so that an electrical signal is applied to the LEDs through the pedestals.

Another embodiment of an LED chip wafer according to the present invention comprises a plurality of LEDs on a wafer and a plurality of contacts, each of which is on one of the LEDs. A fluorescent preform covers at least some of the LEDs, with the preform comprising holes arranged to allow electrical contact to the LEDs through the holes.

Another embodiment of a method for fabricating light emitting diode (LED) chips from a wafer, comprises depositing LED epitaxial layers on an LED growth wafer to form a plurality of LEDs on the growth wafer and forming a fluorescent preform with holes. The fluorescent preform is bonded over at least some of the plurality of LEDs so that at least some light from the covered ones of the LEDs passes through the preform and is converted. An electrical signal is applied to the LEDs through the holes.

These and other aspects and advantages of the invention will become apparent from the following detailed description and the accompanying drawings which illustrate by way of example the features of the invention.

BRIEF DESCRIPTION OF THE DRAWINGS

FIG. 10b is a top view of the LED package shown in FIG. 9a.

DETAILED DESCRIPTION OF THE INVENTION

The present invention provides fabrication methods that are particularly applicable to wafer level incorporation of a light conversion material on semiconductor devices such as LEDs. The present invention also provides semiconductor devices, such as LEDs fabricated using these methods. The present invention allows for covering of LEDs at the wafer level with a light conversion material in the form of wavelength downconverter. In one embodiment, the covering comprises a fluorescent substrate/perform ("preform") containing a wavelength conversion material. The preform and LED chips provide features that allow the preform to align properly with the LEDs for electrical connection to the LEDs through the preform. On some embodiments, the preform has features that mate with features on the LED chip wafer to mount the preform in the desired location. In one embodiment these can include holes in the preform or wafer that mate with projections in the other one of the preform or wafer. In other embodiments, the preform can have a pattern to match a pattern on the wafer for proper alignment.

The preform covers the LEDs while still allowing access to one or more of the contacts for wire bonding. Light emitting from the LEDs passes through the preform where the at least some of the light is absorbed by the downconverting material and re-emitted at different wavelength. In one embodiment, the covered LEDs emit a white light combination of LED and downconverted light.

In one embodiment according to the present invention a preform of appropriate size, shape and thickness is fabricated to cover LEDs at the wafer level. In alternative embodiments, a single LED or groups of LEDs can be covered by the preform. Micro-holes or holes with the appropriate dimensions are made in the preform, with the spacing of the holes in the preform corresponding to the contacts on the LEDs. In one embodiment, and as described in detail below, the holes can be spaced to align with pedestals on the LED chips. Following mounting on the LEDs, the preform can also be planarized to reduce the thickness of the preform and to reveal the pedestals.

Different preform shapes and sizes can be used and performs made of different materials can also be used, depending on the application. Different bonding materials and methods can be used to mount the preform on the LEDs such as known wafer bonding materials and methods. As described in more detail below, different embodiments of the present invention can be arranged in many different ways, with for example, some embodiments having micro-holes extending only partially through the preform. In some of these other embodiments, the multiple preform layers can be used, the preform can have different regions with different phosphor concentrations and multiple phosphors can be used.

The present invention allows for wafer fabrication processes that cover LEDs with a downconverting material, while at the same time allowing electrical contact to the LEDs. Mechanical planarization allows thickness uniformity over the wafer and this thickness uniformity can be achieved over a wide thickness range (e.g. 1 to 100 µm). White LED chip color point may be fine tuned by controlling the final coat thickness, including using an iterative approach (e.g. grind, test, grind, etc.) which will result in tightly binned white LEDs. This approach is also scalable to large wafer sizes. The preform can also be planarized, or the amount of conversion material can be varied, in different areas or regions to control the emission characteristics of a single LED or groups of LEDs on the wafer.

The present invention is described herein with reference to certain embodiments but it is understood that the invention can be embodied in many different forms and should not be construed as limited to the embodiments set forth herein. In particular, the present invention is described below in regards to covering LEDs with a down-converter preform that typically comprises a phosphor in a cured binding material, but it is understood that the present invention can be used to cover LEDs with other materials for down-conversion, protection, light extraction or scattering. It is also understood that the preform can have scattering or light extraction features, particles or materials, and that the coating can be electrically active. The methods according to the present invention can also be used for covering other semiconductor devices with different materials. In different embodiments, the preform can include no phosphors, more than one type of phosphor, scattering particle and/or other materials. A preform may also comprise a material such as an organic dye that provides down-conversion. With multiple preforms and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1A:
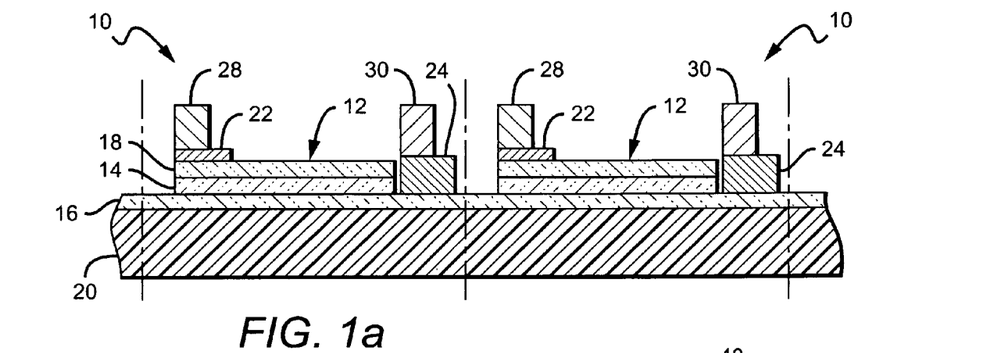
FIGS. 1a through 1g are sectional views of one embodiment of an LED chip wafer at fabrication steps in one method according to the present invention.
Figure 1B:
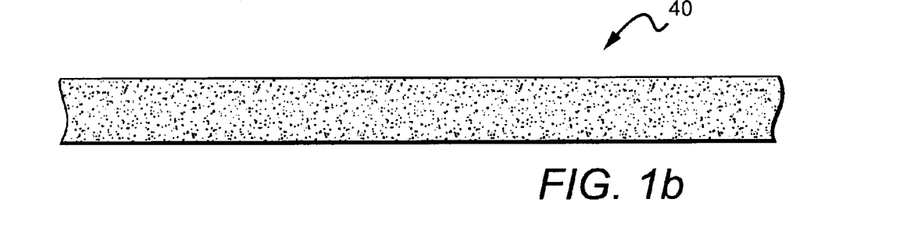
Figure 1C:
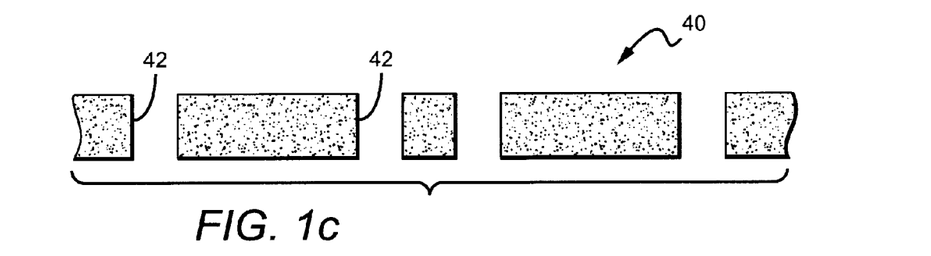
Figure 1D:
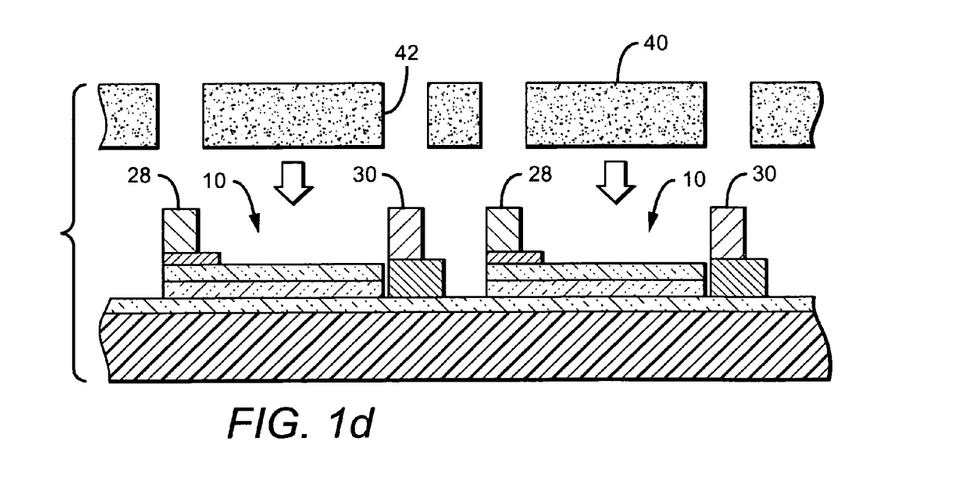
Figure 1E:
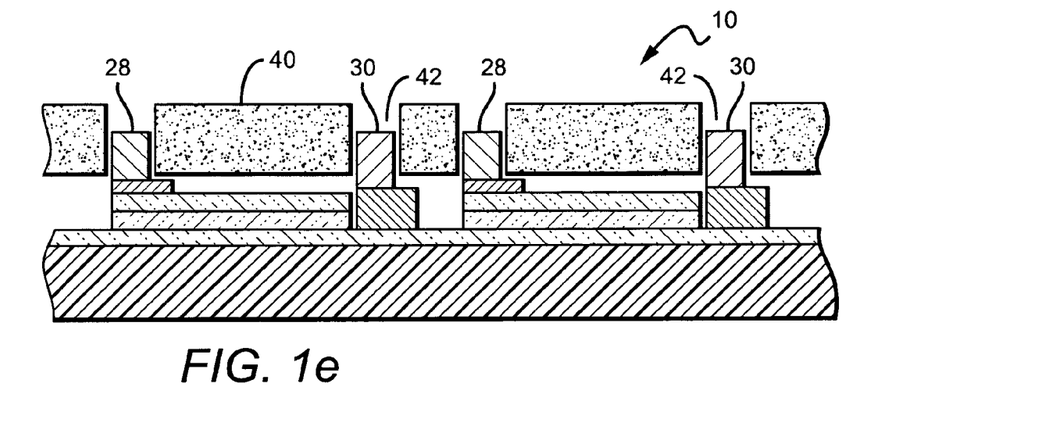
Figure 1F:
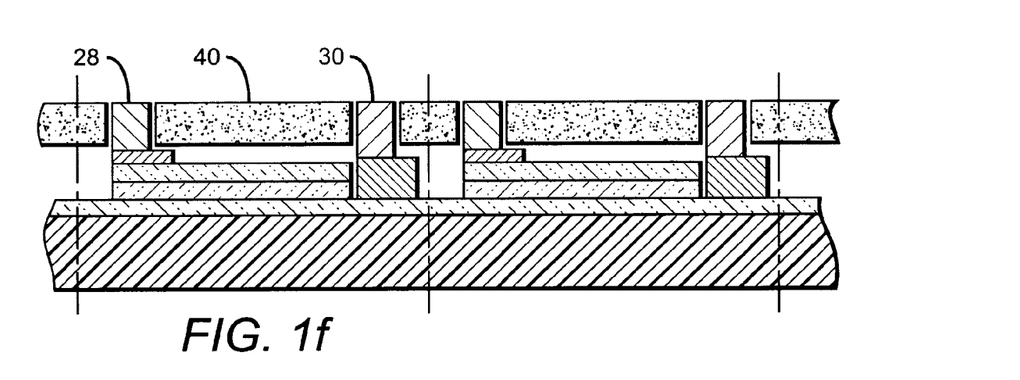
Figure 1G:
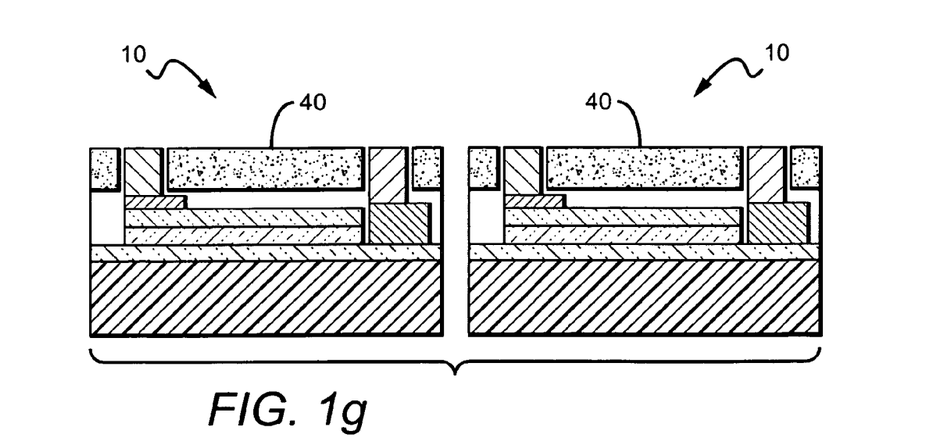

FIGS. 1a through 1g show one embodiment of wafer level LED chips 10 manufactured using a method according to the present invention. Referring now to FIG. 1a, LEDs chips 10 are shown at a wafer level of their fabrication process prior to covering by a light conversion material. That is, the LEDs chips 10 have not been through all the steps necessary before being separated/singulated from wafer into individual LED chips. Phantom lines are included to show separation or a dicing line between the LED chips 10 and following additional fabrication steps, and as shown in FIG. 1g the LEDs chips can be separated into individual devices. FIGS. 1a through 1e also show only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

The present invention can be used with LEDs having different contacts or bond pad features and arrangements, and in one embodiment can be used with LEDs having electrically conducting pedestals/posts. As described in more detail below, electrically conducting pedestals/posts can be formed on one or both of the LED contacts (bond pads) while the LEDs are at the wafer level. Each of the pedestals act as a vertical extension of its contact and the pedestals can have different heights, and are typically contacted following covering by the conversion material, such as by wire bonding. Formation of pedestal on semiconductor devices such as LEDs described in U.S. patent application Ser. No. 11/656,759 and U.S. patent application Ser. No. 11/899,790, both entitled "Wafer Level Phosphor Coating Method and Devices Fabricated Utilizing Method", and both incorporated by reference as though fully set forth herein.

Each of the LED chips 10 comprises a semiconductor LED 12 that can have many different semiconductor layers arranged in different ways. The layers of the LEDs 12 generally comprise an active layer/region 14 sandwiched between first and second oppositely doped epitaxial layers 16, 18, all of which are formed successively on a substrate 20. The materials used for fabrication of LEDs and the methods of fabrication are generally known in the art and only briefly discussed herein as well as in U.S. patent application Ser. No. 11/656,759 and U.S. patent application Ser. No. 11/899,790 incorporated above. In this embodiment the LEDs 12 are shown as separate devices on the substrate 20. This separation can be achieved by having portions of the active region 14 and doped layers 16, 18 etched down to the substrate 20 to form the open areas between the LEDs 12. In other embodiments and as described in more detail below, the active layer 14 and doped layers 16, 18 can remain continuous layers on the substrate 20 and can be separated into individual devices when the LED chips 10 are singulated.

It is understood that additional layers and elements can also be included in the LED 12, including but not limited to buffer, nucleation, contact and current spreading layers as well as light extraction layers and elements. The active region 14 can comprise single quantum well (SQW), multiple quantum well (MQW), double heterostructure or super lattice structures. In one embodiment, the first epitaxial layer 16 is an n-type doped layer and the second epitaxial layer 18 is a p-type doped layer, although in other embodiments the first layer 16 can be p-type doped and the second layer 18 n-type doped. The first and second epitaxial layers 16, 18 are hereinafter referred to as n-type and p-type layers, respectively.

Each of the LEDs 12 can have first and second contacts 22, 24. In the embodiment shown, the LEDs have lateral geometry wherein both contacts 22, 24 are on the top of the LEDs 12. The contacts can comprise known materials deposited using known deposition techniques. It is understood that the present invention can also be used with vertical geometry LEDs having a first contact on the p-type layer and the second contact on the substrate. This arrangement can be used particularly for embodiments having an electrically conductive substrate. In the case of Group-III nitride devices, it is known that a thin semitransparent current spreading layer typically can cover some or the entire p-type layer 18. The first and second contacts 22, 24 are hereinafter referred to as the p-type and n-type contacts respectively.

In the embodiment shown, a p-type contact pedestal 28 is formed on the p-type contact 22 that is utilized to make electrical contact to the p-type contact 24 after phosphor coating of the LEDs 12. The pedestal 28 can be formed of many different electrically conductive materials, can be formed using many different known processes, and can have many different sizes depending on the particular embodiment as described in U.S. patent application Ser. No. 11/656,759 and U.S. patent application Ser. No. 11/899,790 incorporated above.

Referring now to FIG. 1b, a fluorescent preform 40 is formed separately from the LED chips 10, and is arranged to be mounted on the LED chips to absorb at least some of the light emitted from the LEDs and convert the light to a different wavelength. The preform contains a light conversion material, typically one or more phosphors, and can be fabricated using different methods such as injection molding, sintering, chemical/physical deposition, printing and other known techniques. In some embodiments, the preform comprises binder material with light conversion materials dispersed in substantially the same concentration throughout. In other embodiments, and as further described below, the preform can be arranged differently and can have different concentrations throughout.

Different materials can be used for the binder in the preform 40, with materials preferably being robust after curing and substantially transparent in the visible wavelength spectrum. It is understood that materials can also be used that are transparent to wavelengths outside the visible spectrum when used with LEDs transmitting in these spectrums. Suitable materials include silicones, epoxies, glass, inorganic glass, spin-on glass, ceramics, dielectrics, BCB, polymides, polymers and hybrids thereof. In one embodiment silicone can be used as the binder because of its high transparency and reliability in high power LEDs. Suitable phenyl- and methyl-based silicones are commercially available from Dow® Chemical. In other embodiments, the binder material can be engineered to be index matched with the features such as the chip (semiconductor material) and growth substrate, which can reduce total internal reflection (TIR) and improve light extraction. The preforms are typically disc shaped and sized to fit over wafer of LED chips. In alternative embodiments, the preform can have other shapes such as oval, square, rectangular, or any other multiples sided shape, and can cover more or less than the entire wafer of LED chips.

In other embodiments the perform can be made of materials that are stable at high temperatures, such as glass or ceramic. These materials typically have a higher melting temperature than materials such as silicones and fabrication of these performs is typically performed at higher temperature. This fabrication temperature would likely damage the LED chips 10 if the preform material was applied directly to the LED chip in its molten or pre-cured state, as was done in previous LED coating processes. By fabricating the preform separately and then mounting it to the LED chips 10, materials can be used that could otherwise damage the LED chips. This provides flexibility in determining the materials most appropriate for an LED chip design. When these high temperature performs are used the resulting phosphor coating provided by the preform can have higher thermal stability than performs of lower melting temperature materials, and can provide a robust coating useful for high power, high temperature LED chip operation.

Different factors determine the amount of LED light that will be absorbed by the preform in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Many different phosphors can be used in the preform according to the present invention, including but not limited to those described in U.S. patent application Ser. No. 11/656,759 and U.S. patent application Ser. No. 11/899,790. The present invention is particularly adapted to LED chips emitting white light utilizing yellow phosphors with LEDs emitting in the blue spectrum. Additional phosphors can be used to provide a different hue or color temperature, such as red phosphors to provide a warm white light. Different sized phosphor particles can be used including but not limited to 10-100 nanometer (nm)-sized particles to 20-30 µm sized particles, or larger. In other embodiments, the preform can comprise different types of phosphors or can comprise multiple phosphor coatings for monochromatic or polychromatic light sources. The preform can also comprise other elements, such as photon steering elements. The preform can also have different concentrations or loading of phosphor materials in the binder, with a typical concentration being in a range of 30-70% by weight.

The thickness of the preform 40 can exceed 200 µm, but can also be less than this thickness. Mechanical planarization allows thickness uniformity over the wafer and thickness uniformity of the preform to be achieved over a wide thickness range. The preform can have many different thicknesses following planarization, with a range of thicknesses in one embodiment being 1 to 100 µm. In still another embodiment, the suitable range of thicknesses is 30 to 50 µm. In other embodiments, the thickness of the coating can be non-uniform across the wafer or across a single LED, such as to compensate for emission variations across the wafer.

Referring now to FIG. 1c holes 42 are formed in the preform 40 to allow for electrical contact to the LEDs 12, and in the embodiment shown, the holes are spaced and sized to fit over the pedestals 28, 30 on LED 12 (as shown in FIG. 1a). This allows for the preform 40 to be mounted to the LEDs 12 with the pedestals 28, 30 in the holes and available for electrical contact, such as by wire bonds.

Referring now the FIG. 1d, the preform 40 is aligned with the wafer of LED chips 10 so that the pedestals are aligned with the holes 42 to mate the preform 40 to the LED chips 10 at the wafer level. Referring to FIG. 1e, the preform 40 is wafer bonded to the wafer of LED chips 10, with the pedestals 28, 30 arranged in the holes 42. Different known wafer bonding materials can be used including but not limited to silicones, epoxies and glass. Different wafer bonding methods can be used such as thermal compression bonding methods, as well as UV cured bonding and wafer level anodic bonding.

In some embodiments, the height of the pedestals 28, 30 can be less than the thickness of the preform 40, such that the pedestals are recessed in the holes 42. The bonding material can fill any open areas between the preform 40 and the LED chips 12, such as the area between the preform and the n-type mesa. Referring now to FIG. 1f, the preform 40 can be planarized to the height of the pedestals 28, 30 for wire bonding using known planarizing methods. The pedestals 28, 30 can also be decapped to remove wafer bonding material that remains on the top of the pedestals. In other embodiments, the pedestals 28, 30 can remain recessed in the holes 42 with the wire bonds made to the recessed pedestals. As an alternative step, the perform can be micromachined over its entire top surface, portions of its top surface, and the top surface of individual LEDs to tune the emission characteristics of the individual LEDs or groups of LEDs. This process is described in U.S. Provisional Patent Application Ser. No. 61/072,546 entitled "Emission Tuning Methods and Devices Fabricated Utilizing Methods", which is incorporated by reference as though fully set forth herein. It is understood that the micromachining can occur before or after mounting of the preform 40 to the LED chips 10.

Referring now to FIG. 1g, the individual LED chips 10 can be singulated from the wafer using known methods such as dicing, scribe and breaking, or etching. The singulating process separates each of the LED chips 10 with each having substantially the same thickness of preform 40, and as a result, substantially the same amount of phosphor and emission characteristics. This allows for reliable and consistent fabrication of LED chips 10 having similar emission characteristics. Following singulating the LED chips can be mounted in a package, or to a submount or printed circuit board (PCB) without the need for further processing to add phosphor. In one embodiment the package/submount/PCB can have conventional package leads with the pedestals electrically connected to the leads. A conventional encapsulation can then surround the LED chip and electrical connections. In other embodiments, the LED chips can be enclosed by a hermetically sealed cover with an inert atmosphere surrounding the LED chip at or below atmospheric pressure.

Figure 2A:
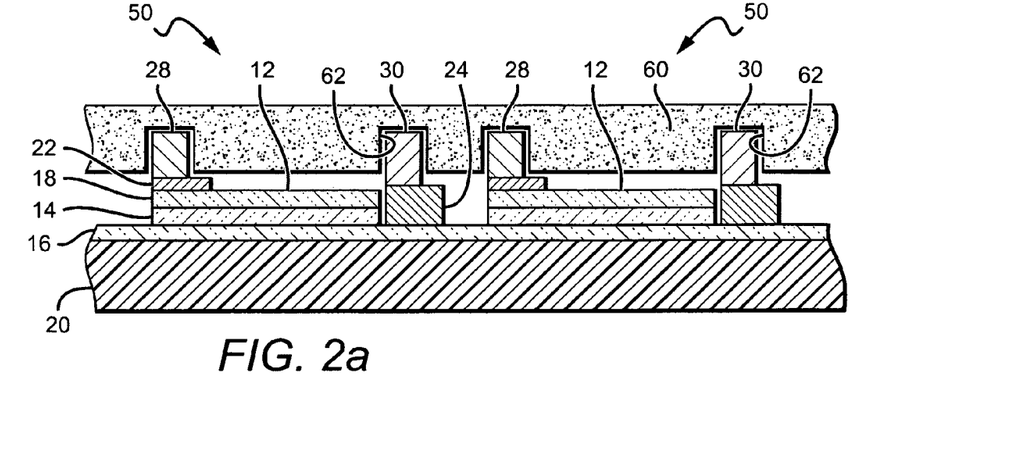
FIGS. 2a and 2b are sectional views of another embodiment of an LED chip wafer at fabrication steps in another method according to the present invention.
Figure 2B:
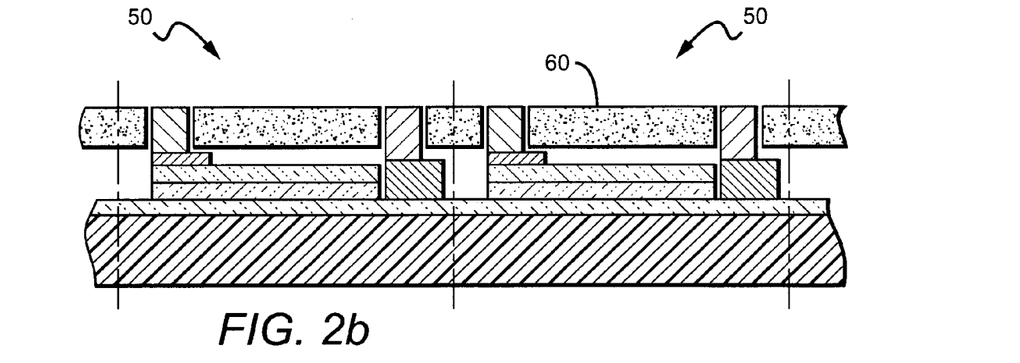

FIGS. 2a and 2b show another embodiment of wafer level LED chips 50 manufactured using methods according to the present invention. The LED chips 50 comprise LEDs 12 that have many of the same features as LEDs 12 shown in FIGS. 1a through 1e and described above, and for the same features the same reference numbers are used herein. Referring to FIG. 2a, each of the LEDs 12 comprise an active region 14 between first and second doped layers 16, 18, a substrate 20, first and second contacts 22, 24, and pedestals 28, 30. A preform 60 is also included having holes 62 spaced and sized to align with pedestals 28, 30. In this embodiment, however, the holes 62 pass only partially though the preform 60.

The preform 60 can be mounted over and wafer bonded in place over the LED chips 10 using the wafer bonding methods and/or materials described above with the embodiment in FIGS. 1a through 1e. The combination of pedestals 28, 30 and partial holes 62 allow for mating of the pedestals in the holes for mechanical self alignment of the preform 60 on the LED chips 50. This mating arrangement can take many different forms of pedestal/contact combinations, with the result being the desired alignment of the preform over the LED chips. In other embodiments, the mating features on the LED chips may not be pedestals/contacts, but instead can be other features on the wafer that may or may not be part of the operation of the resulting LED chips 50. That is, features can be included on the LED chip wafer that are not used in operation of the LED chips, but are instead included for mating with, and alignment of, the preform on the LED chip wafer. Referring now to FIG. 2b, the preform 60 can be planarized to reveal the stud bumps for wire bonding. The LED chips 50 can then be singulated and packaged using the methods described above.

Figure 3:
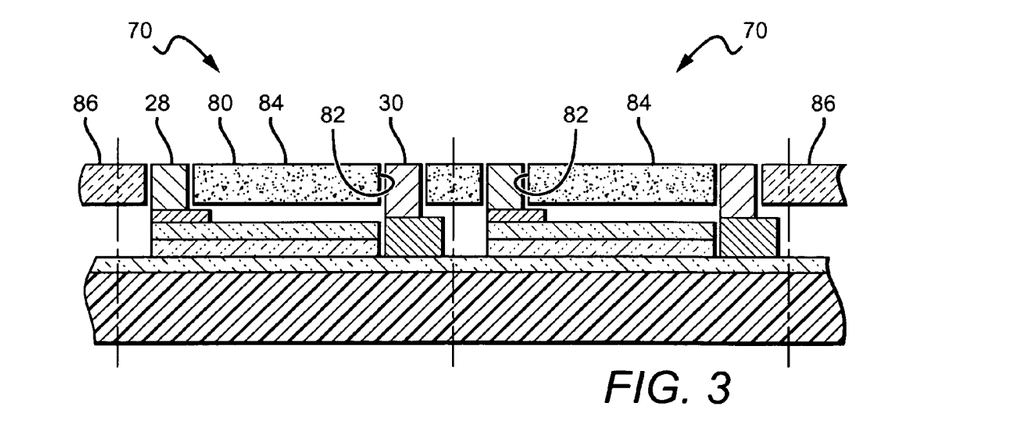
FIG. 3 is a sectional view of another embodiment of an LED chip wafer according to the present invention.

In the embodiments described above, the conversion material is dispersed throughout the preforms, but in other embodiments the conversion material can have different concentrations in different areas of the preform, and in some areas there can be no conversion material. Referring now to FIG. 3, LED chips 70 are shown that have similar features to the LED chips 10 in FIGS. 1a through 1e. A preform 80 with holes 82 for the pedestals 28, 30 is included on the LEDs chips 70 and is wafer mounted in place using the methods described above. In this embodiment, the conversion material is provided in first regions 84. The preform 80 further comprises second regions 86 that can have no conversion material, or can contain different types of conversion material than those found in the first regions 84. In the embodiments where the second regions 86 contain no conversion materials, the regions can be transparent. The first and second regions can be arranged in many different ways and can have many different shapes and sizes.

Still in other embodiments the coating can comprise multiple layers of different concentrations or types of phosphors, and the multiple layers can comprise different binder materials. Referring now to the embodiment shown in FIG. 4, LED chips 90 are shown in wafer form, with the LED chips 90 having similar features to the LED chips 10 in FIGS. 1a through 1e. A first preform 100 is shown wafer bonded on the LED chips 90 using the materials and methods described above. The first preform 100 comprises a conversion material dispersed throughout. A second preform 102 is wafer bonded on the first preform 100, and can contain a different conversion material that is in the first preform. Light from the LED chips passes through the preforms where at least some of the light is converted by the conversion material in the first and second preforms 100, 102. The LED chips can emit a combination of light from the first and second preforms 100, 102, or a combination of light from the first and second preforms 100, 102 and the LEDs 12. In some embodiments, the LEDs chips emit a white light combination of light from the preforms 100, 102 and LEDs 12. In some of these white emitting embodiments, the LEDs 12 can emit blue light and the first and second preforms can have yellow and red conversion material that absorb blue light and emit yellow and red light, respectively. At least some of the blue light from the LEDs is absorbed in the preforms 100, 102 and is converted such that the LED chips 90 can emit a white light combination of blue, yellow and red. The preforms 100, 102 can also have holes 104, 106, respectively, with the pedestals 28, 30 arranged in the holes 104, 106 and accessible for wire bonding.

Figure 4:
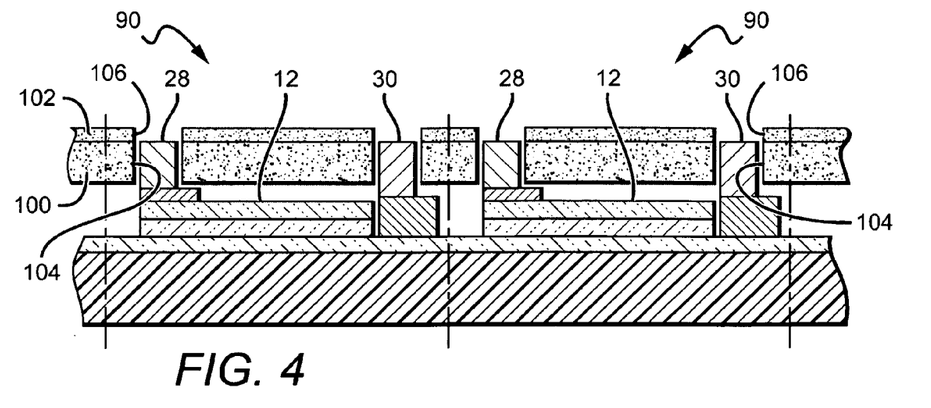
FIG. 4 is a sectional view of another embodiment of an LED chip wafer according to the present invention with a multiple layer preform.

Although the first and second preforms 100, 102 are shown and described as being separate, it is understood that they can also be formed/molded as a single preform with holes to align with the pedestals. In other embodiments, the preforms can have different regions with different concentrations of phosphors as described above. In still other embodiments one or more of the layers can be provided without phosphors and can be substantially transparent to the LED light.

Figure 5:
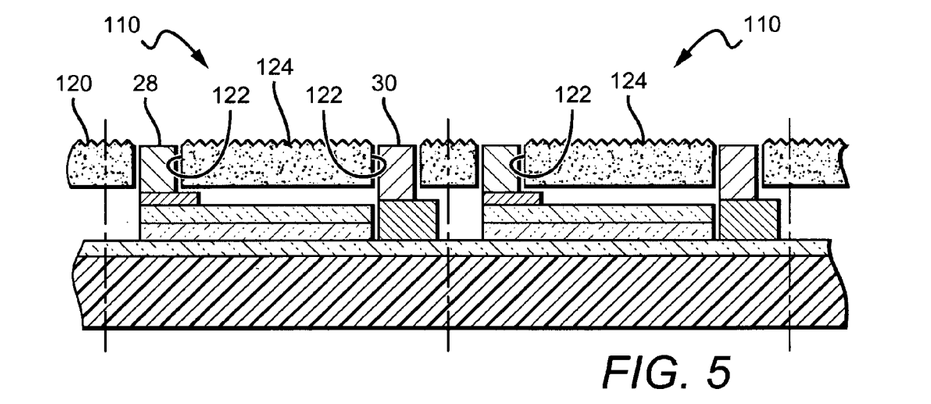
FIG. 5 is a sectional view of another embodiment of an LED chip wafer according to the present invention with a textured preform.

In different embodiments of the present invention, surfaces of the preform can comprise features to enhance light extraction. Referring now to FIG. 5, LED chips 110 are shown that have similar features to the LED chips 10 in FIGS. 1a through 1e. A preform 120 with holes 122 is wafer bonded on the LED chips 110, with the pedestals 28, 30 arranged in the holes 122, as described above. In this embodiment however the top surface of the preform 120 has roughened or textured features 124 to enhance light extraction. Many different texturing methods can be used such as laser texturing, mechanical shaping, or micro-nano imprinting methods, to enhance light extraction. Texturing can result in surface features that are 0.1-5 μm tall or deep, and preferably 0.2-1 μm. In other embodiments, the bottom or side surfaces of the preform 120 can also be shaped or textured for improved light extraction, and surfaces of the LEDs can be shaped or textured.

Figure 6:
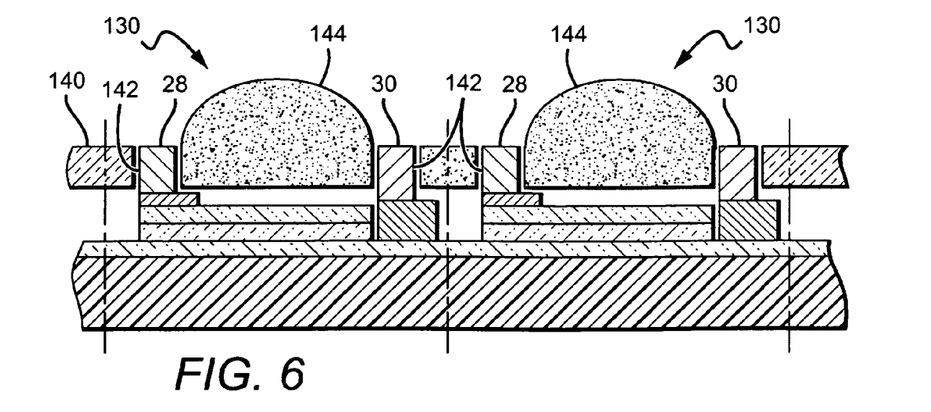
FIG. 6 is a sectional view of another embodiment of an LED chip wafer according to the present invention having lenses on its preform.

The preform can include other features to enhance light extraction and/or focus or shape the light from the LEDs. Referring now to FIG. 6, LED chips 130 are shown that have similar features as the LED chips 10 in FIGS. 1a through 1e. A preform 140 with holes 142 is wafer bonded on the LED chips 130, with the pedestals 28, 30 arranged in the holes 142, as described above. In this embodiment the top surface of the preform 140 can have lenses 144 on its top surface to provide certain advantages including but not limited to focusing light and/or enhancing light extraction. The lenses 144 can have many different shapes and sizes and in the embodiment shown, each lens covers the top surface of the preform 140, between holes 142, with the pedestals 28, 30 accessible through the holes 142. Accordingly, each of the lenses 144 covers the surface of the preform 140 between the pedestals 28, 30. It is understood that the lenses 144 can be arranged in many different ways, can have many different shapes such as oval, egg or bullet shapes, and can comprise multiple convex or concave surfaces. In other embodiments multiple lenses can be used for each of the lenses 144. The lenses 144 can cover more or less of the top surface of the preform 140, and in one embodiment the holes 142 can be through part of the lenses 144.

Figure 7A:
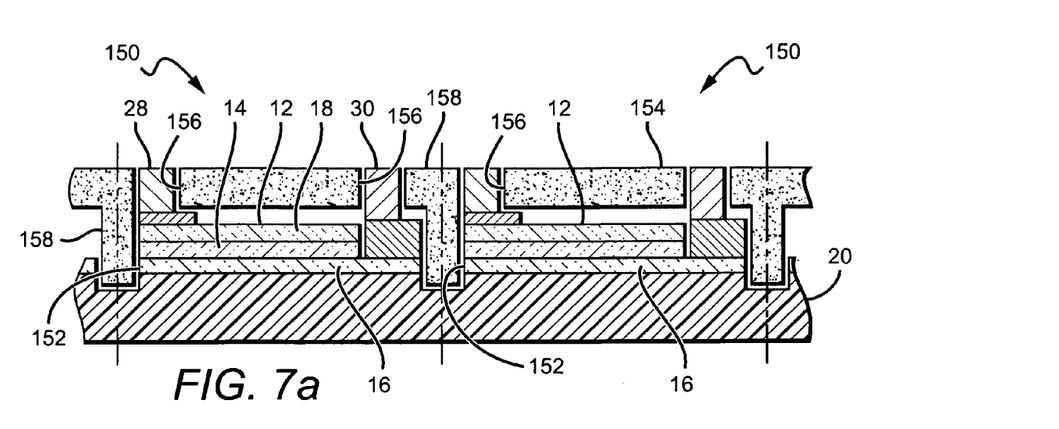
FIGS. 7a and 7b are sectional views of another embodiment of an LED chip wafer according to the present invention comprising trenches.
Figure 7B:
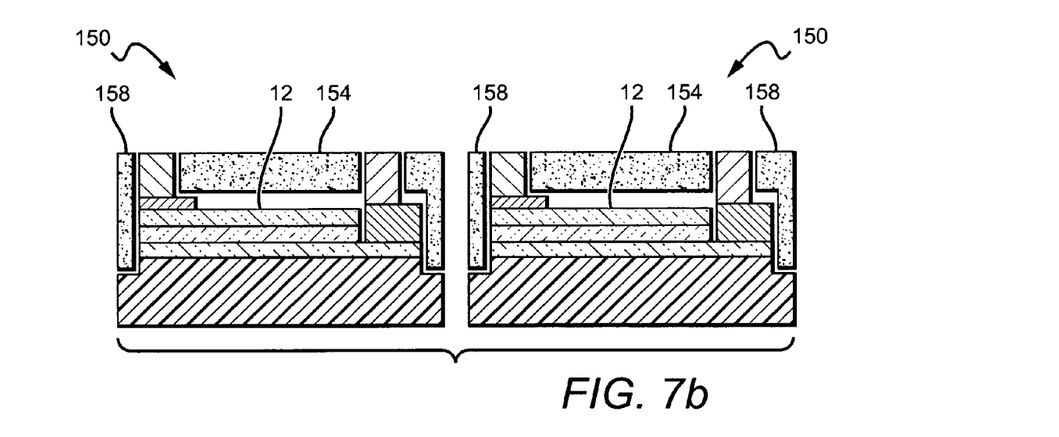

Referring now back to FIG. 1e, when the LED chips 10 are singulated, the preform 40 can cover only the top surface of the LEDs. The side surfaces of the LED, including the side surfaces of the active region 14 and oppositely doped layers 16, 18 can be uncovered by the preform 40. Light from the active region 14 can emit from the side surfaces without first passing through the conversion material, with this unconverted emission known as leakage emission. This can be acceptable in many applications, but in others it may be desirable to minimize this leakage emission. Referring now to FIG. 7a through 7b, LED chips 150 are shown that have similar features to the LED chips 10 in FIGS. 1a through 1e, and for the similar features the same reference numbers are used. In this embodiment trenches 152 are included between the LEDs 12 that can be formed using conventional ablation, etching or cutting processes. The trenches 152 as shown extend down through the second doped layer 18, and partially into the substrate 20. It is understood, however, that in other embodiments the trenches 152 can extend further into the substrate 20 or can pass through less than the entire active region 14 and doped layers 16, 18.

A preform 154 is provided that can be made of the same materials using the same methods as described above also comprises holes 156 sized and spaced for the pedestal 28, 30 as described above. The preform 154 further comprises strips 158 sized and arranged to mate with the trenches 152. The preform 154 is wafer mounted to the LEDs chips 150 using the materials and methods described above, with the pedestals 28, 30 in the holes 156 and the strips 158 in the trenches 152. When the LED chips are singulated, as shown in FIG. 7b, portions of the preform 154 from the strips 158 remains on the sides of the LEDs 12. Light emitting from the side surfaces of the LEDs 12 passes through conversion material where at least some of the light is converted. The arrangement helps minimize or reduce the amount of LED leakage emission through the side surfaces.

Figure 8A:
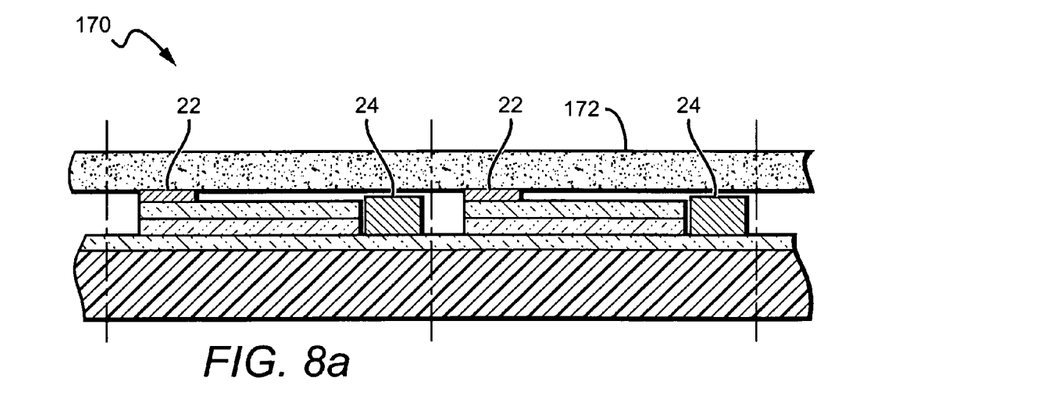
FIGS. 8a and 8b are sectional views of another embodiment of an LED chip wafer according to the present invention.
Figure 8B:
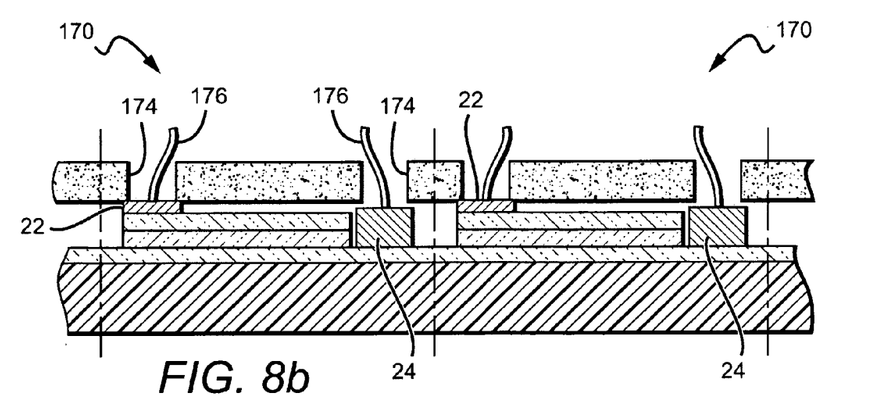

The present invention can be used in fabricating LED chips that do not have pedestals. Referring now to FIGS. 8a and 8b, LED chips 170 are shown that have similar features to the LED chips 10 in FIGS. 1a through 1e, except that they do not comprise pedestals. Instead, the LED chips have conventional contacts 22, 24 as described above. A preform 172 is wafer mounted to the LED chips and as shown in FIG. 8a, this embodiment shows a preform that does not have holes aligned with the contacts 22, 24. Referring now to FIG. 8b, holes 174 can be formed in the preform that are sized and spaced to allow access to the contacts 22, 24. The holes 174 can be formed using many different methods, including laser ablation, laser or chemical etching, or by using mechanical methods such as formation through micro drilling using commercially available micro drilling systems. In one embodiment according to the present invention, a map can be formed for the desired locations of the holes 172 in the preform 170. The map can be used as a guide for the location of the holes 172, or can be used in forming a mask for etching or laser ablation of the holes 172. Alternatively, the preform 172 and wafer of LED chips 170 can have alignment features such as a pattern on the preform 172 to match the alignment features on the wafer. The alignment features can take many different forms such as patterns on the preform 172 to match a pattern on the wafer, or pads on the preform 172 to match metal pads on the wafer. A microwire 176 can be formed on each of the LED chip's contacts 22, 24, through the preform holes 174. Different methods can be used for forming the microware, with a suitable method being micro soldering to the contacts. The microwire can have different lengths and widths that allow it to withstand subsequent processing steps, with a suitable length being in the range of 5-500 µm and width being the range of 50-200 µm. The LED chips can then be singulated and packaged using the different methods described above. The microwires can be made of many different conductive materials such as Au, Cu and other metals alone or in combination. In other embodiments, holes 174 can be formed in the preform 172 prior to mounting to the LED chips, with the wire bonds formed on the contacts 22, 24 following mounting of the preform 172.

It is understood that the present invention can also be used for fabricating many different types of LED chips beyond those described above. For the LED chips described above having transparent substrates, light from the LEDs that is emitted toward substrate can pass out of the LED chip 10 through the substrate without passing through the conversion material. This can be acceptable for generating certain colors or hues of light. In embodiments where this substrate emission or absorption is to be prevented or minimized, the substrate can be opaque (such as Si) so that light from the LED emitted toward the substrate is blocked or absorbed so that most light emitting from the LED chip comes from light passing through the preform.

Figure 9:
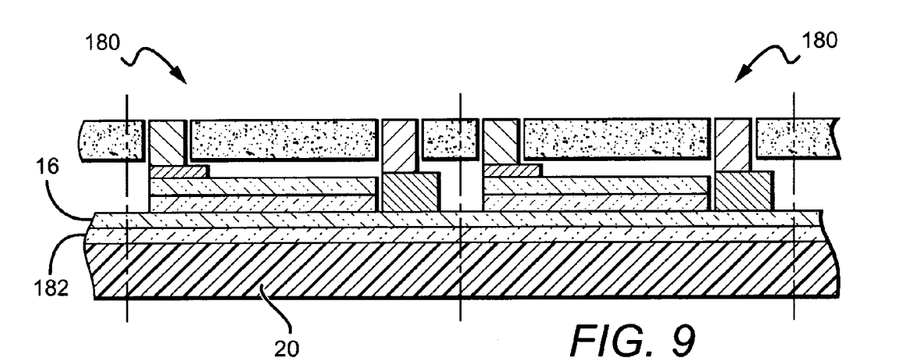
FIG. 9 is a sectional view of another embodiment of an LED chip wafer according to the present invention comprising a reflective surface.

FIG. 9 shows another embodiment of LED chips 180 that are similar to the LED chips 10 described above and shown in FIGS. 1a through 1g, but having additional features to encourage emission of LED chip light toward the top of the LED chips 180 and to minimize light passing into the substrate 20. LED chips 180 comprise a reflective layer 182 that is arranged to reflect light emitted from the active region toward the substrate 20, back toward the top of the LED chips 180. This reflective layer 182 reduces the emission of light from the LEDs 12 that does not pass through conversion material before emitting from the LED chips 180, such as through the substrate 20 and encourages emission toward the top of the LED chips 180 and through the preform 40.

The reflective layer 182 can be arranged in different ways and in different locations in the LED chip 180, with the layer 182 as shown arranged between the n-type layer 16 and the substrate 20. The layer 182 can comprise different materials including but not limited to a metal or a semiconductor reflector such as a distributed Bragg reflector (DBR). It is also understood that reflective layers can also be included on the substrate 20.

The present invention can also be used to cover individual LEDs chips instead of those formed in an LED chip wafer. In one embodiment, the LED chips can be singulated and then mounted in a package or to a submount or PCB. A preform can then be bonded to each of the LED chips with the pedestals in the preform holes. The particular preform can have the desired thickness, and conversion material type and concentration for the desired emission characteristics of the LED package. A library of preforms can be available with each of the preforms having different characteristics that can be matched with the LED chips during packaging to achieve the desired package emission characteristics. The LED chips can also be planarized according to the present invention to further alter or control the emission characteristics of the LED package.

Embodiments of LED chips according to the present invention can also comprise additional features to further enhance light emission uniformity and efficiency. Current spreading structures can be included on the LEDs to improve current spreading and injection from the first contacts. The current spreading structure can have many different forms, but preferably comprises fingers of conductive material on the surface of the LED contacting the first (p-type) contact. The current spreading structure can be deposited using known methods and can comprise the materials described above for the contacts and pedestals including Au, Cu, Ni, In, Al, Ag or combinations thereof and conducting oxides and transparent conducting oxides.

Another advantage of the methods according to the present invention is that the preforms can be robust enough to provide mechanical support for the LED epitaxial layers. This allows for wafer level fabrication of LEDs with the preforms acting as the carrier substrate. That is, the preform can be robust enough to serve as the mechanical support for the LED so that a carrier substrate is not needed. The LED fabricated according to methods described herein can have the growth substrate removed using known methods, or can be provided without a growth substrate or a carrier substrate. This provides for a number of advantages such as providing thinner end devices, and because the substrate may not exhibit good thermal conduction, its removal can improve thermal conduction away from the LEDs.

Figure 10A:
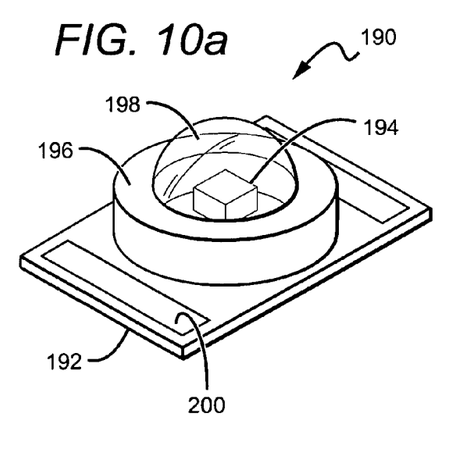
FIG. 10a is a perspective view of one embodiment of an LED package according to the present invention.
Figure 10B:
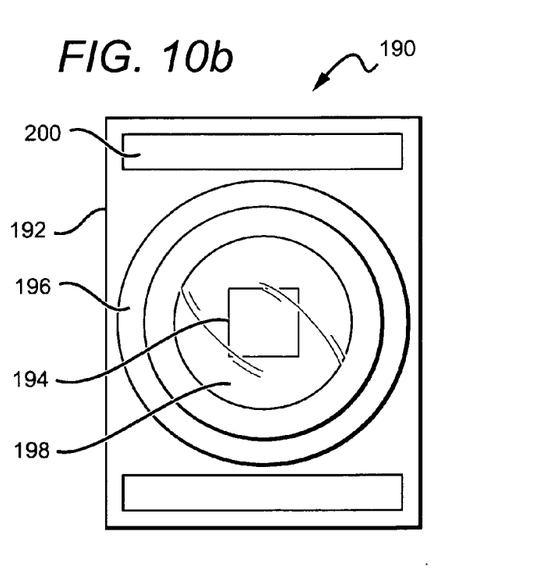

As described above, following singulating the LED chips can be mounted in different LED packages. FIGS. 10a and 10b show one embodiment of an LED package 190 utilizing one or more LED chips according to the present invention. The package 190 generally comprises a substrate/submount ("submount") 192 and an LED chip 194 mounted on the substrate 192. A reflector cup assembly ("reflector cup") 196 is mounted on the submount 192, but it is understood that packages can also be provided that do not have reflector cups. Secondary optics, such as a lens 198 can be placed over the LED 194, such as on the reflector cup 196 and mounted to the package using different methods. Light from the LED 194 passes primarily through the lens 198 with at least some of the light emitted laterally from the LED chip being reflected by the reflector cup 196 to contribute to useful emission from the package 190. Space between the bottom of the lens 198 and the remainder of the package 190 can be filled with an encapsulating material such as a silicone gel (not shown) with the bottom of the lens 198 in contact with the gel. The package 190 can then be heat cured, which causes the encapsulating material to solidify and adhere to the lens 198, bonding the lens 198 in place over the LED 194 and reflector cup 196. Many different lenses and encapsulating materials can be used in the packages according to the present invention to provide different output characteristics.

The submount 192 may be formed of many different materials with a preferred material being electrically insulating. Suitable materials include, but are not limited to aluminum oxide or aluminum nitride. The reflector cup 196 should be formed of durable, high melting temperature material that can withstand subsequent packaging manufacturing steps and the heat generated by the package during operation. Many different materials can be used, such as high melting temperature material including plastics, such a Novella resin, or liquid crystal polymers. The submount 192 has a top surface comprising electrical traces 200 providing a conductive path for electrical connection to the LED 194 using known contacting methods.

In LED packages utilizing convention coating methods such as the "glob" method or EPD, much of the area within the reflective cup 196 can be covered by a conversion material and its binder, including the LED chip, the surface of the substrate, and the surfaces of the reflective cup. Utilizing LED chips fabricated according to the present invention, the phosphor/binder coating is confined to the LED chip with the other surfaces remaining uncovered. The LED package 190 can also compensate for emission of unconverted light around the edges of the LED package, by reflecting the unconverted light to mix with the converted light.

Although the present invention has been described in detail with reference to certain preferred configurations thereof, other versions are possible. Therefore, the spirit and scope of the invention should not be limited to the versions described above.

We claim:

1. A light emitting diode (LED) chip wafer, comprising:
   a plurality of LEDs on a wafer, said wafer comprising a first alignment element;
   a fluorescent preform covering at least some of said LEDs and contacting at least two of said plurality of LEDs, said preform comprising a second alignment element, said first and second alignment elements cooperating to provide the desired alignment of said preform over said LEDs; and
   wherein said wafer is capable of being separated into LED chips.

2. The LED chip wafer of claim 1, wherein said second alignment element comprises a hole and said first alignment element comprises a pedestal.

3. The LED chip wafer of claim 1, wherein said first alignment element comprises a pattern on said wafer and said second alignment element comprises a pattern on said preform.

4. The LED chip wafer of claim 1, wherein said second alignment element comprises a hole and said first alignment element comprises a contact.

5. The LED chip wafer of claim 1, wherein light from the covered ones of said LEDs passes through said preform and is converted.

6. A light emitting diode (LED) chip wafer, comprising:
   a plurality of LEDs on a wafer;
   a plurality of pedestals, each of which is on one of said LEDs;
   a fluorescent preform covering at least some of said LEDs and contacting at least two of said plurality of LEDs, said preform comprising holes with said pedestals within said holes such that during operation of the covered ones of said LEDs at least some light from said LEDs passes through said preform and is converted; and
   wherein said wafer is capable of being separated into LED chips.

7. The LED chip wafer of claim 6, wherein said LEDs covered by said preform emit a white light comprising light from said LED and converted light from said preform.

8. The LED chip wafer of claim 6, further comprising a plurality of contacts each of which is on one of said LEDs, wherein each of said pedestals is on a contact.

9. The LED chip wafer of claim 6, wherein said preform comprises a phosphor and a binder.

10. The LED chip wafer of claim 9, wherein said preform comprises a phosphor to absorb light from said LED and emit yellow light.

11. The LED chip wafer of claim 9, wherein the concentration of said phosphor is substantially uniform throughout said preform.

12. The LED chip wafer of claim 9, wherein the concentration of said phosphor is non-uniform.

13. The LED chip wafer of claim 6, wherein said preform is textured.

14. The LED chip wafer of claim 6, wherein said preform comprises lenses.

15. The LED chip wafer of claim 6, further comprising covering at least some of said LEDs with a second fluorescent preform.

16. The LED chip wafer of claim 6, further comprising a reflective layer.

17. The LED chip wafer of claim 6, wherein said preform provides mechanical support for at least some of said LEDs.

18. A light emitting diode (LED) chip, comprising:
a laterally configured LED;
at least one pedestal in electrical contact with said LED; and
a fluorescent preform bonded to and at least partially covering said LED, said preform comprising at least one hole with said at least one pedestal therein, at least some of the light emitted by said LED passing through and converted by said preform.

19. The LED chip of claim 18, wherein said LED chip emits a combination of light from said LED and from said fluorescent preform.

20. The LED chip of claim 18, wherein said preform provides mechanical support for said LED.

21. The LED chip of claim 18, wherein said preform comprises a phosphor and a binder.

22. The LED chip of claim 21, wherein the concentration of said phosphor is substantially uniform throughout said preform.

23. The LED chip of claim 21, wherein the concentration of said phosphor is non-uniform throughout said preform.

24. The LED chip of claim 18, wherein said preform is textured.

25. The LED chip of claim 18, wherein said preform comprises lenses.

26. The LED chip of claim 18, further comprising a second fluorescent preform covering at least some of said LEDs and converting light from said LEDs.

27. A light emitting diode (LED) chip wafer, comprising:
a plurality of LEDs on a wafer, further comprising a plurality of pedestals, at least two of which are on each of said LEDs;
a plurality of contacts, at least two of which are on one of said LEDs; and
a fluorescent preform covering at least some of said LEDs, said preform comprising holes configured to allow electrical contact to said LEDs through said holes, each of said pedestals in one of said holes.

28. The light emitting diode (LED) chip of claim 18, wherein said at least one pedestal comprises multiple pedestals and said at least one hole comprises multiple holes, said chip configured such that respective ones of said pedestals are in respective ones of said holes.

* * * * *